United States Patent
Chen et al.

(10) Patent No.: US 6,861,339 B2
(45) Date of Patent: Mar. 1, 2005

(54) METHOD FOR FABRICATING LAMINATED SILICON GATE ELECTRODE

(75) Inventors: Chia-Lin Chen, Hsinchu (TW); Liang-Gi Yao, Hsing-Chu (TW); Shih-Chang Chen, Taoyuan (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/274,570

(22) Filed: Oct. 21, 2002

(65) Prior Publication Data

US 2004/0077155 A1 Apr. 22, 2004

(51) Int. Cl.$^7$ .................. H01L 21/20; H01L 21/26
(52) U.S. Cl. ............... 438/488; 438/308; 438/482; 438/795
(58) Field of Search ................ 438/378, 795, 438/797, 308, 198, 482, 488, 509, 964, 260, 255

(56) References Cited

U.S. PATENT DOCUMENTS

| | | | | |
|---|---|---|---|---|
| 4,224,084 A | * | 9/1980 | Pankove | 257/646 |
| 4,285,762 A | * | 8/1981 | Moustakas | 438/719 |
| 5,710,454 A | | 1/1998 | Wu | |
| 5,739,043 A | * | 4/1998 | Yamamoto | 438/535 |
| 6,013,577 A | | 1/2000 | Kimizuka | |
| 6,159,810 A | * | 12/2000 | Yang | 438/301 |
| 6,162,716 A | | 12/2000 | Yu et al. | |
| 6,188,104 B1 | | 2/2001 | Choi et al. | |
| 6,287,944 B1 | * | 9/2001 | Hara et al. | 438/488 |
| 2001/0023971 A1 | * | 9/2001 | Kondo et al. | 257/458 |
| 2002/0013114 A1 | * | 1/2002 | Ohtani et al. | 445/23 |

* cited by examiner

*Primary Examiner*—Matthew Smith
*Assistant Examiner*—Lex H. Malsawma
(74) *Attorney, Agent, or Firm*—Tung & Associates

(57) ABSTRACT

Within a method for forming a silicon layer, there is employed at least one sub-layer formed of a higher crystalline silicon material and at least one sub-layer formed of a lower crystalline silicon material. The lower crystalline silicon material is formed employing a hydrogen treatment of the higher crystalline silicon material. The method is particularly useful for forming polysilicon based gate electrodes with enhanced dimensional control and enhanced performance.

14 Claims, 2 Drawing Sheets

METHOD FOR FABRICATING LAMINATED SILICON GATE ELECTRODE

BACKGROUND OF THE INVENTION

1. Field of the Invention

The present invention relates generally to methods for fabricating microelectronic fabrications. More particularly, the present invention relates to methods for fabricating gate electrodes within field effect devices within semiconductor integrated circuit microelectronic fabrications.

2. Description of the Related Art

Essential in the art of semiconductor integrated circuit microelectronic fabrication is the fabrication and use of field effect devices, such as field effect transistor (FET) devices. Field effect devices generally employ a gate electrode separated from a semiconductor substrate by a gate dielectric layer, to thus form a conductor/insulator/semiconductor capacitor, where charge carrier species concentrations are modulated within a channel region of the semiconductor substrate incident charge injection into the gate electrode.

While gate electrodes are thus desirable in the art of integrated circuit fabrication and often essential in the art of integrated circuit fabrication, gate electrodes are nonetheless not entirely without problems in the art of integrated circuit fabrication. In that regard, it is often difficult in the art of integrated circuit fabrication to fabricate gate electrodes with enhanced dimensional control and enhanced performance.

It is thus desirable in the art of integrated circuit fabrication to fabricate gate electrodes with enhanced dimensional control and enhanced performance.

It is towards the foregoing object that the present invention is directed.

Various gate electrode structures having desirable properties, and methods for fabrication thereof, have been disclosed in the art of integrated circuit fabrication.

Included among the gate electrode structures and methods for fabrication thereof, but not limited among the gate electrode structures and methods for fabrication thereof, are gate electrode structures and methods for fabrication thereof disclosed within: (1) Wu, in U.S. Pat. No. 5,710,454 (a stacked amorphous silicon layer method for forming a tungsten silicide polycide gate electrode); (2) Kimizuka, in U.S. Pat. No. 6,013,577 (an amorphizing ion implant method for forming a polysilicon gate electrode with an amorphous silicon surface; (3) Yu et al., in U.S. Pat. No. 6,162,716 (a multi-layer amorphous silicon gate electrode with mis-matched grain boundaries); and (4) Choi et al., in U.S. Pat. No. 6,188,104 (a trench field effect transistor (FET) device having formed therein a laminated amorphous silicon/polysilicon gate electrode). The disclosures of each of the foregoing references are incorporated herein fully by reference.

Desirable in the art of integrated circuit fabrication are additional methods and materials for forming, with enhanced dimensional control and enhanced performance, gate electrodes within integrated circuit devices.

It is towards the foregoing object that the present invention is directed.

SUMMARY OF THE INVENTION

A first object of the present invention is to provide a method for forming a gate electrode for use within an integrated circuit device.

A second object of the present invention is to provide a method in accord with the first object of the present invention, wherein the gate electrode is formed with enhanced dimensional control and enhanced performance.

In accord with the objects of the present invention, there is provided a method for forming a silicon layer.

To practice the method of the present invention, there is first provided a substrate. There is then formed over the substrate a silicon layer, wherein the silicon layer comprises at least one sub-layer formed of a higher crystalline silicon material and at least one sub-layer formed of a lower crystalline silicon material. Within the present invention, the lower crystalline silicon material is formed incident to a hydrogen containing material treatment of the higher crystalline silicon material.

The present invention provides a method for forming a gate electrode for use within an integrated circuit, wherein the gate electrode is formed with enhanced dimensional control and enhanced performance.

The present invention realizes the foregoing objects within the context of forming a silicon layer over a substrate, wherein the silicon layer may be employed for forming a gate electrode within an integrated circuit device. Within the present invention, the silicon layer comprises at least one sub-layer formed of a higher crystalline silicon material and at least one sub-layer formed of a lower crystalline silicon material. In addition, within the present invention, the lower crystalline silicon material is formed incident to a hydrogen containing material treatment of the higher crystalline silicon material. By employing within the context of the present the lower crystalline silicon material as at least either an upper layer or a lower layer within a gate electrode, the gate electrode is formed with enhanced dimensional control and enhanced performance within a microelectronic fabrication, since the lower crystalline silicon material provides a smoother surface with enhanced electrical properties.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a method for forming a gate electrode for use within an integrated circuit, wherein the gate electrode is formed with enhanced dimensional control and enhanced performance.

The present invention realizes the foregoing objects within the context of forming a silicon layer over a substrate, wherein the silicon layer may be employed for forming a gate electrode within an integrated circuit device. Within the present invention, the silicon layer comprises at least one sub-layer formed of a higher crystalline silicon material and at least one sub-layer formed of a lower crystalline silicon material. In addition, within the present invention, the lower crystalline silicon material is formed incident to a hydrogen containing material treatment of the higher crystalline silicon material. By employing within the context of the present the lower crystalline silicon material as at least either an upper layer or a lower layer within a gate electrode, the gate electrode is formed with enhanced dimensional control and enhanced performance within a microelectronic fabrication, since the lower crystalline silicon material provides a smoother surface with enhanced electrical properties.

While the preferred embodiment of the present invention illustrates the invention most particularly within the context of forming a polysilicon based gate electrode for use within a field effect transistor (FET) device within a semiconductor integrated circuit microelectronic fabrication, the present invention is not intended to be so limited. Rather, the present invention may be employed for forming silicon layers, and in particular polysilicon layers, within various applications where surface smoothness and enhanced electrical properties are desired. Such polysilicon layers with enhanced surface smoothness may be employed as layers other than gate electrodes, such as for example patterned conductor interconnect layers, within microelectronic fabrications which need not necessarily include field effect devices. Such microelectronic fabrications may include, but are not limited to integrated circuit microelectronic fabrications, ceramic substrate microelectronic fabrications and optoelectronic microelectronic fabrications. Within the context of forming a silicon layer in accord with the present invention as a gate electrode within a field effect device, such as a field effect transistor (FET) device, the gate electrode may be employed within field effect devices including but not limited to planar field effect devices and trench field effect devices.

Referring now to FIG. 1 to FIG. 6, there is shown a series of schematic cross-sectional diagrams illustrating the results of progressive stages of fabricating, in accord with a preferred embodiment of the present invention, a gate electrode for use within a field effect transistor (FET) device within a semiconductor integrated circuit microelectronic fabrication.

Figure 1:
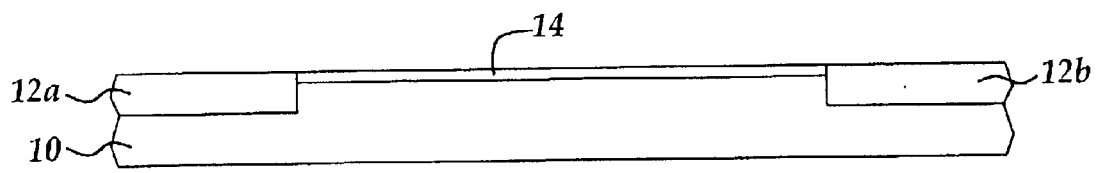
FIG. 1, FIG. 2, FIG. 3, FIG. 4, FIG. 5 and FIG. 6 show a series of schematic cross-sectional diagrams illustrating the results of progressive stages of fabricating, in accord with a preferred embodiment of the present invention, a gate electrode for use within a field effect transistor (FET) device within a semiconductor integrated circuit microelectronic fabrication.

Shown in FIG. 1 is a schematic cross-sectional diagram of the semiconductor integrated circuit microelectronic fabrication at an early stage of its fabrication in accord with the preferred embodiment of the present invention.

Shown in FIG. 1, in a fist instance, is a semiconductor substrate 10 having formed therein a pair of isolation regions 12a and 12b which define an active region of the semiconductor substrate 10. In turn, as is also illustrated within FIG. 1, the active region of the semiconductor substrate 10 has formed thereupon a gate dielectric layer 14.

Within the preferred embodiment of the present invention, the semiconductor substrate 10 may be selected from the group including but not limited to silicon semiconductor substrates, germanium semiconductor substrates and silicon-germanium alloy semiconductor substrates.

Within the preferred embodiment of the present invention, the pair of isolation regions 12a and 12b may be formed employing methods and materials as are conventional in the art of microelectronic fabrication, to form the pair of isolation regions 12a and 12b as isolation regions including but not limited to shallow trench isolation (STI) regions and local oxidation of silicon (LOCOS) isolation regions.

Within the preferred embodiment of the present invention, the gate dielectric layer 14 is typically and preferably formed incident to thermal oxidation of the semiconductor substrate 10 to form the gate dielectric layer 14 of thickness from about 17 to about 35 angstroms.

Figure 2:
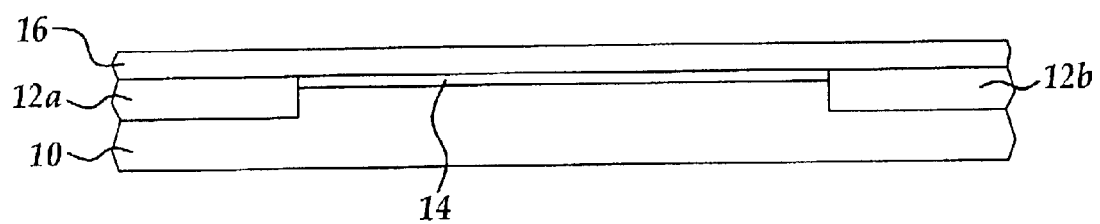

Referring now to FIG. 2, there is shown a schematic cross-sectional diagram illustrating the results of further processing of the semiconductor integrated circuit microelectronic fabrication whose schematic cross-sectional diagram is illustrated in FIG. 1.

As is illustrated in FIG. 2, there is formed upon the pair of isolation regions 12a and 12b and the gate dielectric layer 14 a blanket first silicon layer 16. Within the preferred embodiment of the present invention, the blanket first silicon layer 16 is formed of a polysilicon material, typically and preferably formed employing a chemical vapor deposition (CVD) method employing a silicon source material such as but not limited to silane or disilane.

Typically and preferably, the chemical vapor deposition (CVD) method also employs: (1) a reactor chamber pressure of from temperature of from about 600 to about 660 degrees centigrade; (3) a 5 to about 50 volume percent silicon source material in hydrogen or helium carrier gas at an aggregate flow rate of from about 1000 to about 4000 standard cubic centimeters per minute (sccm). Typically and preferably, the blanket first silicon layer 16 is formed to a thickness of from about 200 to about 1000 angstroms.

Figure 3:
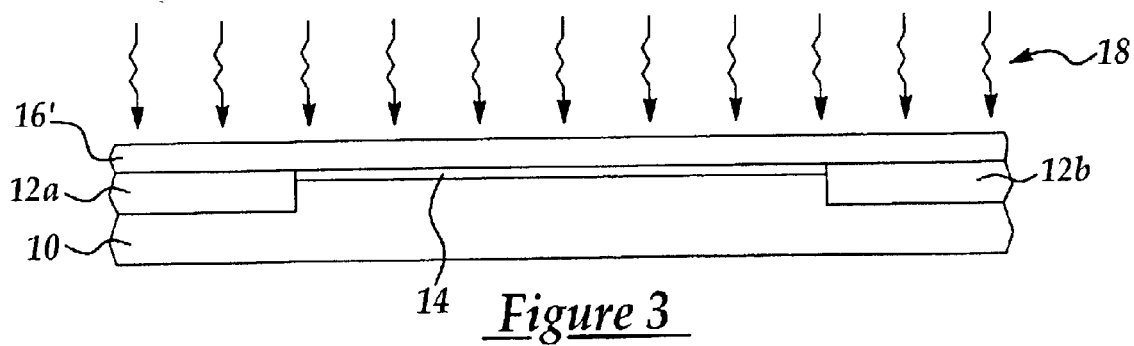

Referring now to FIG. 3, there is shown a schematic cross-sectional diagram illustrating the results of further processing of the semiconductor integrated circuit microelectronic fabrication whose schematic cross-sectional diagram is illustrated in FIG. 2.

As is illustrated within FIG. 3, the blanket first silicon layer 16 which is formed of the polysilicon material is treated with a first hydrogen treatment 18 to form therefrom a hydrogen treated blanket first silicon layer 16'.

Within the present invention, such a hydrogen treatment of a silicon layer formed of a polysilicon material to form therefrom a hydrogen treated silicon layer causes for a reduction of crystallinity of the polysilicon material. The reduction of crystallinity of the polysilicon material provides a partial polysilicon material comprising at least in part an amorphous silicon material.

Within the present invention, the first hydrogen treatment 18 may be effected employing a hydrogen treatment selected from the group including but not limited to hydrogen thermal annealing treatments and hydrogen containing plasma treatments.

When employing a hydrogen thermal annealing treatment for the first hydrogen treatment 18 when forming from the blanket first silicon layer 16 the hydrogen treated blanket first silicon layer 16', the hydrogen thermal annealing treatment employs: (1) a semiconductor substrate 10 and blanket first silicon layer 16 temperature of from about 600 to about 660 degrees centigrade; (2) a hydrogen containing material (such as hydrogen or hydrazine) flow rate of from about 500 to about 5000 standard cubic centimeters per minute (sccm); and (3) a hydrogen treatment time of from about 1 to about 3 minutes.

When employing a hydrogen containing plasma treatment for the first hydrogen treatment 18 when forming from the blanket first silicon layer 18 the hydrogen treated blanket first silicon layer 161, the hydrogen containing plasma employs: (1) a reactor chamber pressure of from about 200 to about 300 torr; and (2) a semiconductor substrate 10 and blanket first silicon layer 16 temperature of from about 600 to about 660 degrees centigrade.

Within the context of either of the two foregoing hydrogen treatments, there is provided a reduction of crystallinity of the blanket first silicon layer 16 when formed of a polysilicon material typically a columnar polysilicon material. Typically and preferably, the hydrogen treated blanket first silicon layer 16' has a crystallinity of from about 5 to about 50 percent of the blanket first silicon layer 16. A more severe hydrogen treatment may provide a more complete reduction of crystallinity to yield a completely amorphous silicon material for the hydrogen treated blanket first silicon layer 16', but such is typically not preferred within the present invention.

Figure 4:
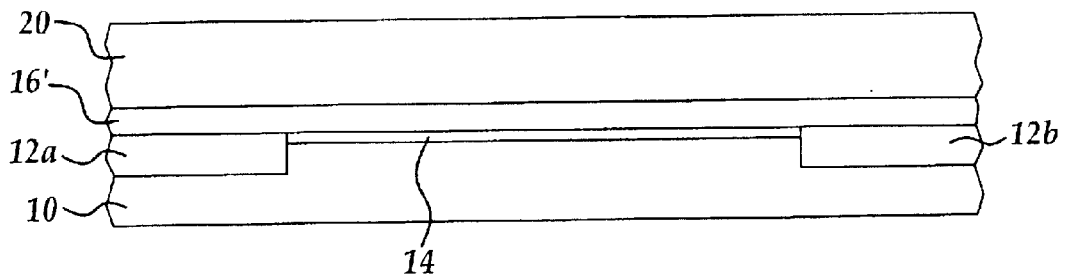

Referring now to FIG. 4, there is shown a schematic cross-sectional diagram illustrating the results of further processing of the semiconductor integrated circuit microelectronic fabrication whose schematic cross-sectional diagram is illustrated in FIG. 3.

Shown in FIG. 4 is the results of forming upon the hydrogen treated blanket first silicon layer 16' a blanket second silicon layer 20.

Within the preferred embodiment of the present invention, the blanket second silicon layer 20 may be formed employing methods and materials analogous or equivalent to the methods and materials employed for forming the blanket first silicon layer 16 as illustrated within the schematic cross-sectional diagram of FIG. 2. Typically and preferably, the blanket second silicon layer 20 is formed to a thickness of from about 200 to about 1000 angstroms.

Figure 5:
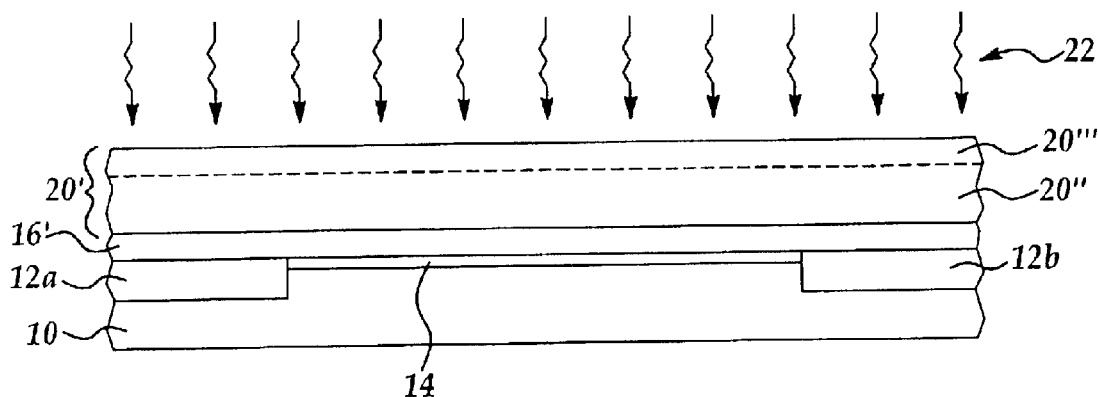

Referring now to FIG. 5, there is shown a schematic cross-sectional diagram illustrating the results of further processing of the microelectronic fabrication whose schematic cross-sectional diagram is illustrated in FIG. 4.

As is illustrated within the schematic cross-sectional diagram of FIG. 5, the blanket second silicon layer 20 has been treated with a second hydrogen treatment 22 to form therefrom a hydrogen treated blanket second silicon layer 20' comprising a blanket hydrogen untreated second silicon sub-layer 20'' and a blanket hydrogen treated second silicon sub-layer 20'''.

Within the preferred embodiment of the present invention, the second hydrogen treatment 22 is otherwise generally analogous or equivalent to the first hydrogen treatment 18 as illustrated within the schematic cross-sectional diagram of FIG. 3, but since the blanket second silicon layer 20 is formed to a greater thickness than the blanket first silicon layer 16, the hydrogen treated blanket second silicon sub-layer 20''' of the hydrogen treated blanket second silicon layer 20' is not formed for the entire thickness of the blanket second silicon layer 20. Typically and preferably, the hydrogen untreated blanket second silicon sub-layer 20'' is formed to a thickness of from about 200 to about 1000 angstroms and the hydrogen treated blanket second silicon sub-layer 20''' is formed to a thickness of from about 200 to about 1000 angstroms.

Figure 6:
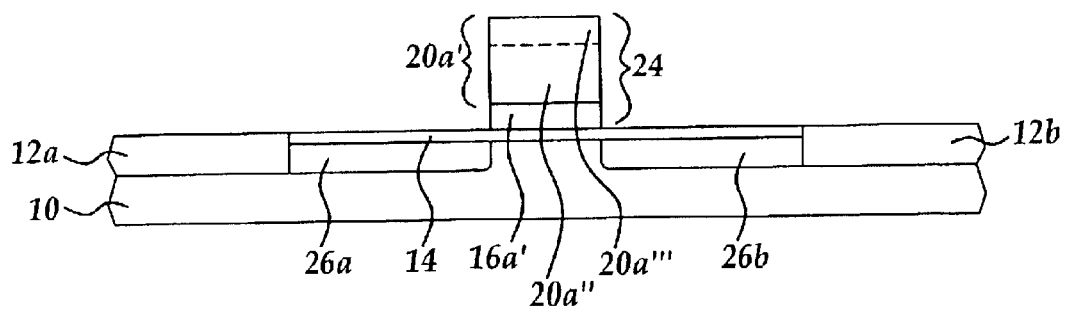

Referring now to FIG. 6, there is shown a schematic cross-sectional diagram illustrating the results of further processing of the semiconductor integrated circuit microelectronic fabrication whose schematic cross-sectional diagram is illustrated in FIG. 5.

As is illustrated in FIG. 6, the hydrogen treated blanket second silicon layer 20' and the hydrogen treated blanket first silicon layer 16' have been patterned to form a hydrogen treated patterned second silicon layer 20a' (comprising a hydrogen untreated patterned second silicon sub-layer 20a'' and a hydrogen treated patterned second silicon sub-layer 20a''') and a corresponding hydrogen treated patterned first silicon layer 16a', where the aggregate of the foregoing patterned layers forms a composite silicon layer as a gate electrode 24 within a field effect transistor (FET) device within the semiconductor integrated circuit microelectronic fabrication whose schematic cross-sectional diagram is illustrated in FIG. 6.

Also illustrated within the schematic cross-sectional diagram of FIG. 6, and also comprising the field effect transistor (FET) device is a pair of source/drain regions 26a and 26b formed into the active region of the semiconductor substrate 10 at locations not covered by the gate electrode 24.

Within the preferred embodiment of the present invention, the patterning of the hydrogen treated blanket second silicon layer 20' and the hydrogen treated blanket first silicon layer 16' to form the corresponding hydrogen treated patterned second silicon layer 20a' and the hydrogen treated patterned first silicon layer 16a' may be effected employing methods as are conventional in the art of semiconductor integrated circuit microelectronic fabrication. Similarly, the pair of source/drain regions 26a and 26b may also be formed employing methods as are conventional in the art of semiconductor integrated circuit microelectronic fabrication.

Upon forming the semiconductor integrated circuit microelectronic fabrication whose schematic cross-sectional diagram is illustrated in FIG. 6, there is formed a semiconductor integrated circuit microelectronic fabrication having formed therein a field effect transistor (FET) device in accord with the preferred embodiment of the present invention. Within the semiconductor integrated circuit microelectronic fabrication, a gate electrode within the field effect transistor (FET) device is formed with multiple silicon layers having differing crystallinity, and in particular a polysilicon middle layer having formed thereupon and there beneath a pair of hydrogen treated polysilicon layers having lesser crystallinity than the polysilicon middle layer.

Within the present invention, the lesser crystalline silicon layer formed beneath the middle layer of the gate electrode provides the gate electrode with enhanced performance insofar as the lesser crystallinity provides for smooth contact with the gate dielectric layer. Such enhanced performance may be measured in terms of enhanced carrier mobility, decreased sheet resistance and enhanced dopant diffusion inhibition. Similarly, the lesser crystalline silicon layer formed upon the middle layer of the gate electrode provides for enhanced dimensional control when forming the gate electrode, since the reduced crystallinity provides for a smoother surface which is more readily uniformly and precisely patterned.

As is understood by a person skilled in the art, although the preferred embodiment of the present invention illustrates the present invention within the context of a gate electrode within a field effect transistor (FET) device formed of a polysilicon middle layer laminated on both of its top surface and bottom surface with a hydrogen material treated silicon layer of lesser crystallinity, the present invention also provides value within the context of a gate electrode (or other silicon layer) formed of a middle polysilicon layer having laminated to only either its top or bottom a lesser crystalline silicon layer formed employing a hydrogen treatment method.

As is understood by a person skilled in the art, the preferred embodiment of the present invention is illustrative of the present invention rather than limiting of the present invention. Revisions and modifications may be made to methods, materials, structures and dimensions in accord with the preferred embodiment of the present invention, while still providing a semiconductor integrated circuit microelectronic fabrication in accord with the present invention, further in accord with the accompanying claims.

What is claimed is:

1. A method for forming a silicon layer comprising:

providing a substrate;

forming over the substrate a silicon layer, wherein the silicon layer comprises at least one sub-layer formed of a higher crystalline silicon material upon at least one sub-layer formed of a lower crystalline silicon material, and wherein the lower crystalline silicon material is formed incident to a hydrogen containing material treatment of the higher crystalline silicon material.

2. The method of claim 1 wherein the silicon layer comprises a higher crystalline silicon material sub-layer sandwiched between a pair of lower crystalline silicon material sub-layers.

3. The method of claim 1 wherein the higher crystalline silicon material is polysilicon and the lower crystalline silicon material is a material comprising amorphous silicon.

4. The method of claim 1 wherein the hydrogen treatment is selected from the group consisting of a hydrogen thermal annealing treatment and a hydrogen plasma treatment.

5. The method of claim 1 wherein the lower crystalline silicon material has a crystallinity of from about 70 to about 90 percent of the higher crystalline silicon material.

6. A method for forming a gate electrode comprising:

providing a semiconductor substrate;

forming over the semiconductor substrate a silicon gate electrode, wherein the silicon gate electrode comprises at least one sub-layer formed of a higher crystalline silicon material upon at least one sub-layer formed of a lower crystalline silicon material, and wherein the lower crystalline silicon material has a crystallinity of from about 70 to about 90 percent of the higher crystalline silicon material.

7. The method of claim 6 wherein the silicon gate electrode comprises a higher crystalline silicon material sub-layer sandwiched between a pair of lower crystalline silicon material sub-layers.

8. The method of claim 6 wherein the higher crystalline silicon material is polysilicon and the lower crystalline silicon material is a lower crystalline silicon material comprising amorphous silicon.

9. The method of claim 6 further comprising a hydrogen treatment step of the higher crystalline silicon material selected from the group consisting of a hydrogen thermal annealing treatment and a hydrogen plasma treatment.

10. The method of claim 6 wherein the gate electrode is formed within a field effect device selected from the group consisting of planar field effect devices and trench field effect devices.

11. A method for forming a silicon layer comprising:

providing a substrate;

forming over the substrate a silicon layer, wherein the silicon layer comprises a higher crystalline silicon material sub-layer sandwiched between a pair of lower crystalline silicon material sub-layers, and wherein the lower crystalline silicon material is formed incident to a hydrogen containing material treatment of the higher crystalline silicon material.

12. The method of claim 11 wherein the higher crystalline silicon material is polysilicon and the lower crystalline silicon material is a material comprising amorphous silicon.

13. The method of claim 11 wherein the hydrogen treatment is selected from the group consisting of a hydrogen thermal annealing treatment and a hydrogen plasma treatment.

14. The method of claim 11 wherein the lower crystalline silicon material has a crystallinity of from about 70 to about 90 percent of the higher crystalline silicon material.

* * * * *